United States Patent
Santoro et al.

(10) Patent No.: US 11,178,797 B2
(45) Date of Patent: Nov. 16, 2021

(54) LOUDSPEAKER SYSTEM COOLING

(71) Applicant: Bose Corporation, Framingham, MA (US)

(72) Inventors: Peter C. Santoro, Groton, MA (US); Thomas E. MacDonald, Boston, MA (US)

(73) Assignee: Bose Corporation, Framingham, MA (US)

( * ) Notice: Subject to any disclaimer, the term of this patent is extended or adjusted under 35 U.S.C. 154(b) by 30 days.

(21) Appl. No.: 16/669,682

(22) Filed: Oct. 31, 2019

(65) Prior Publication Data

US 2021/0136961 A1    May 6, 2021

(51) Int. Cl.
*H04R 1/02* (2006.01)
*H05K 7/20* (2006.01)
*H04R 1/40* (2006.01)

(52) U.S. Cl.
CPC .......... *H05K 7/20918* (2013.01); *H04R 1/02* (2013.01); *H04R 1/403* (2013.01); *H04R 2201/403* (2013.01); *H04R 2400/11* (2013.01)

(58) Field of Classification Search
CPC ...... H04R 2201/403; H04R 9/06; H04R 3/12; H04R 2201/401
USPC ............................................ 381/87, 332–336
See application file for complete search history.

(56) References Cited

U.S. PATENT DOCUMENTS

| | | | |
|---|---|---|---|
| 7,319,767 B2 | 1/2008 | Fidlin et al. | |
| 8,042,783 B2 | 10/2011 | Santoro | |
| 2006/0151237 A1 | 7/2006 | Oxford et al. | |
| 2008/0135713 A1* | 6/2008 | Santoro | A47B 97/04 248/346.03 |
| 2011/0216921 A1* | 9/2011 | Tseng | H04R 25/00 381/164 |
| 2013/0213730 A1 | 8/2013 | Litovsky et al. | |
| 2014/0376758 A1* | 12/2014 | Barcel | H04R 1/023 381/334 |
| 2017/0188134 A1* | 6/2017 | Lage | H04R 1/2857 |

FOREIGN PATENT DOCUMENTS

WO    88/10054 A1    12/1988

OTHER PUBLICATIONS

International Search Report and Written Opinion dated Feb. 4, 2021 for PCT/US2020/058229.

* cited by examiner

*Primary Examiner* — George C Monikang
(74) *Attorney, Agent, or Firm* — Bose Corporation

(57) ABSTRACT

A loudspeaker system includes a line array assembly and a base for supporting the line array assembly. The line array assembly includes a plurality of electro-acoustic transducers arranged along a vertical axis and the base houses electronics for powering the line array assembly. The base and the line array assembly together define a flow path to facilitate a convective air flow to pass between the base and the line array assembly for cooling the electronics.

23 Claims, 16 Drawing Sheets

LOUDSPEAKER SYSTEM COOLING

BACKGROUND

This disclosure relates to loudspeaker system cooling.

SUMMARY

All examples and features mentioned below can be combined in any technically possible way.

In one aspect, a loudspeaker system includes a line array assembly and a base for supporting the line array assembly. The line array assembly includes a plurality of electro-acoustic transducers arranged along a vertical axis and the base houses electronics for powering the line array assembly. The base and the line array assembly together define a flow path to facilitate a convective air flow to pass between the base and the line array assembly for cooling the electronics.

Implementations may include one of the following features, or any combination thereof.

In some implementations, the loudspeaker system includes a receptacle supported by the base for receiving a portion of the line array assembly. The base, the receptacle, and the line array assembly together define a flow path to facilitate a convective air flow to pass between the base and the line array assembly for cooling the electronics.

In certain implementations, the base includes a base housing that defines an electronics cavity within which the electronics are enclosed. The receptacle includes one or more first apertures in fluid communication with the electronics cavity and the line array assembly includes one or more second apertures which are placed in fluid communication with the one or more first apertures when the line array assembly is supported base.

In some cases, the housing includes one or more third apertures to allow ambient air to enter the electronics cavity.

In certain cases, the loudspeaker system includes an air mover (e.g., disposed in the electronics cavity and/or in the line array assembly) that is arranged to draw a convective air flow into the electronics cavity via the one or more third apertures and to move the convective air flow across the electronics and toward the one or more first apertures.

In some examples, the loudspeaker system also includes a duct that fluidically couples the air mover to the one or more third apertures.

In certain examples, the line array assembly includes one or more third apertures in fluid communication with the one or more second apertures, thereby to allow the convective air flow to pass from the one or more second apertures through the line array assembly and out of the one or more third apertures.

In certain cases, the line array assembly includes one or more third apertures in fluid communication with the one or more second apertures, thereby to allow the convective air flow to pass from the one or more third apertures through the line array assembly and out of the one or more second apertures.

In some examples, the loudspeaker system includes an air mover arranged to draw a convective air flow into the line array assembly via the one or more third apertures and to move the convective air flow into the electronics cavity via the first and second apertures.

In some implementations, the loudspeaker system includes a heat sink that is thermally coupled to the receptacle and the electronics, thereby to facilitate thermal heat transfer from the electronics to the receptacle.

In certain implementations, the heat sink formed integrally with the receptacle.

In some cases, the heatsink includes a plate extending outwardly from the receptacle and supporting the electronics.

In certain cases, the heatsink includes a fin that extends outwardly from the plate. The fin abuts a heat producing component of the electronics for dissipating thermal energy therefrom.

In some examples, the loudspeaker system includes a thermally conductive grease disposed between the fin and the heat producing component to provide a thermally conductive path therebetween.

In certain examples, the loudspeaker system includes an air mover to encourage the convective air flow to move from the base into the line array assembly.

In some implementations, the base includes a base housing that defines an electronics cavity within which the electronics are enclosed, and the air mover is disposed within the electronics cavity.

In certain implementations, the base housing includes one or more first apertures for allowing a convective air flow to enter the electronics cavity from a region external to the housing, and the base includes a duct disposed within the electronics cavity and fluidically coupling the one or more first apertures to the air mover.

In some cases, the line array assembly includes an array housing that defines an acoustic cavity. The array housing supports the electro-acoustic transducers such that respective first radiating surfaces of the electro-acoustic transducers radiate acoustic energy outwardly from a first surface of the array housing and respective second radiating surfaces of the electro-acoustic transducers radiate acoustic energy into the acoustic cavity.

In certain cases, the array housing defines an air flow cavity for accommodating the convective air flow, the air flow cavity being acoustically isolated from the acoustic cavity.

In some examples, the line array assembly includes one or more first apertures arranged along a rear surface of the housing, opposite the front surface, and in fluid communication with the air flow cavity, and one or more second apertures arranged along the front surface of the housing and in fluid communication with the air flow cavity such that the convective air flow can enter the air flow cavity via the one or more first apertures and can be exhausted from the air flow cavity via the one or more second apertures.

In certain examples, the line array assembly includes a first housing and a second housing. The first housing defines an acoustic cavity. The first housing supports the electro-acoustic transducers such that respective first radiating surfaces of the electro-acoustic transducers radiate acoustic energy outwardly from a first surface of the first housing and respective second radiating surfaces of the electro-acoustic transducers radiate acoustic energy into the acoustic cavity. The second housing defines an air flow cavity for accommodating the convective air flow, and the second housing is releasably coupled to the first housing.

In some implementations, the loudspeaker system includes a receptacle that is supported by the base for receiving a portion of the line array assembly. The base, the receptacle, and the line array assembly together define a flow path to facilitate a convective air flow from the base and through the line array assembly for cooling the electronics. The receptacle is configured to receive a bottom end portion of the second housing.

In certain implementations, the loudspeaker system includes an air mover that is arranged to encourage the convective air flow to move from the line array assembly and into the base.

In some cases, the housing includes one or more third apertures to allow the convective air flow to be exhausted from the electronics cavity.

Figure 1A:
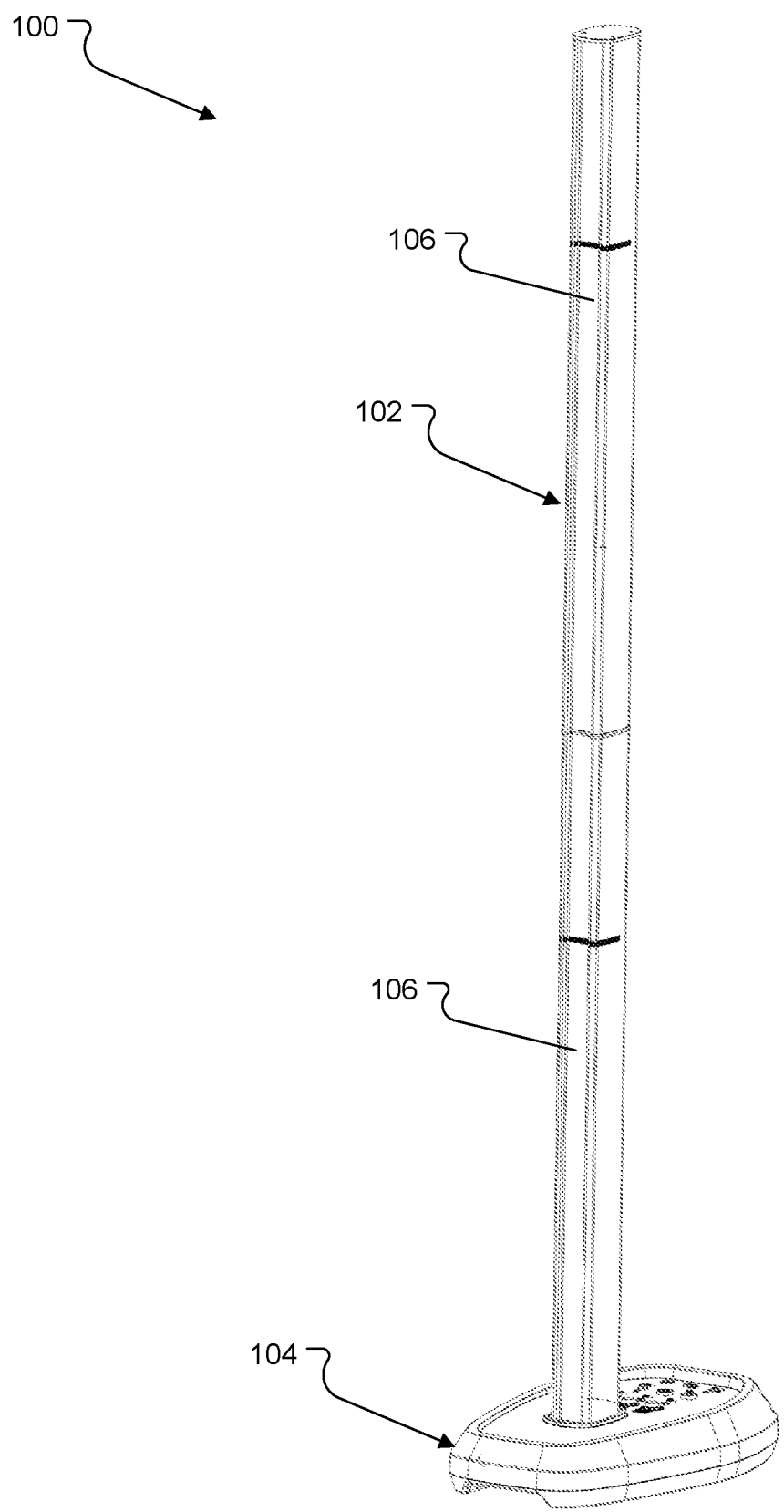
FIG. 1A is a perspective view of a loudspeaker system from the front, top, and right side.

It is noted that the drawings of the various implementations are not necessarily to scale. The drawings are intended to depict only typical aspects of the disclosure, and therefore should not be considered as limiting the scope of the implementations. In the drawings, like numbering represents like elements between the drawings.

DETAILED DESCRIPTION

Figure 1B:
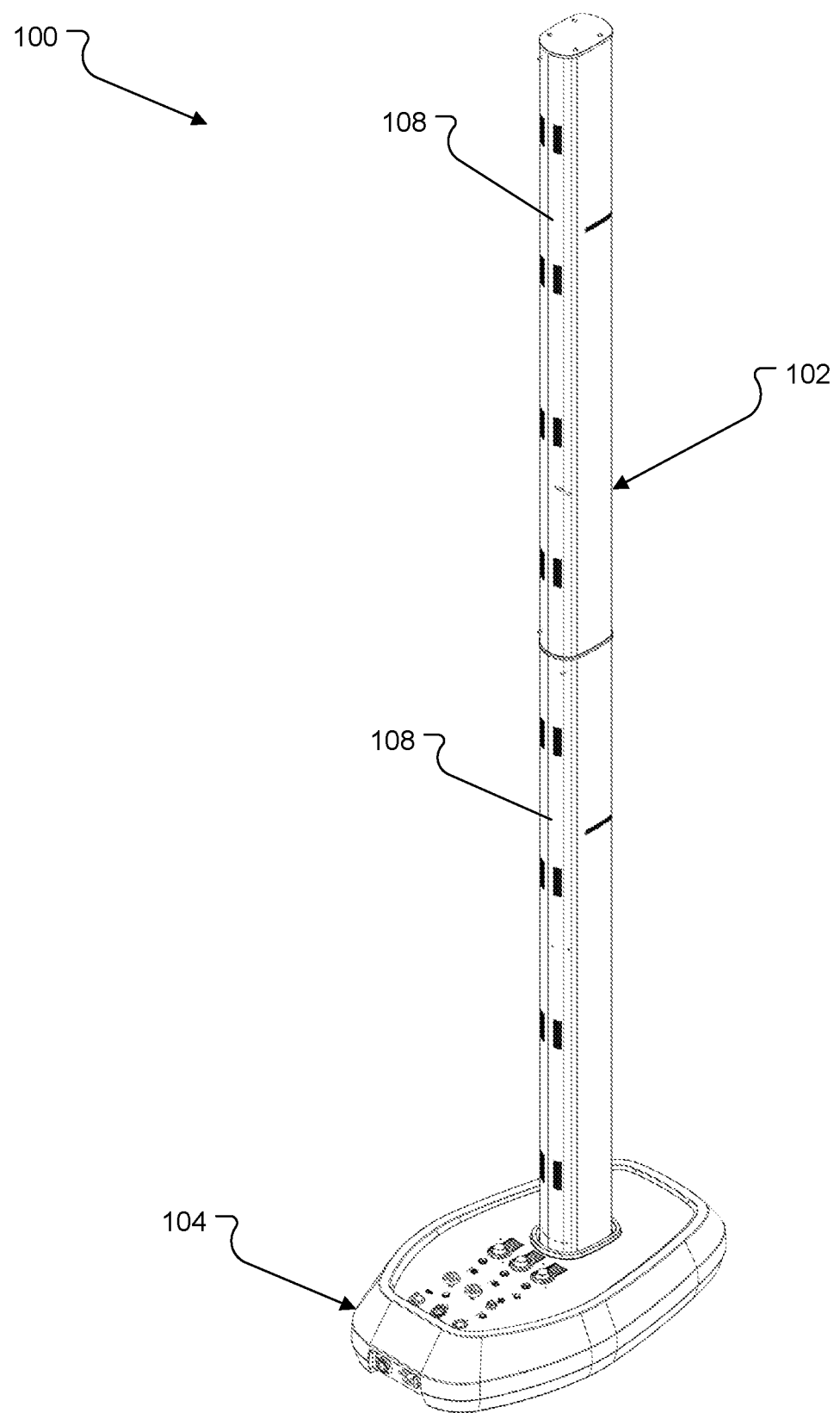
FIG. 1B is a perspective view of the loudspeaker system of FIG. 1A from the back, top, and left side.

With reference to FIGS. 1A and 1B, a loudspeaker system 100 includes a line array assembly 102 and a base 104 for supporting and powering the line array assembly 102. base 104. As discussed in further detail below, a convective air flow can pass between the base the line array to facilitate cooling of the electronics.

Figure 2A:
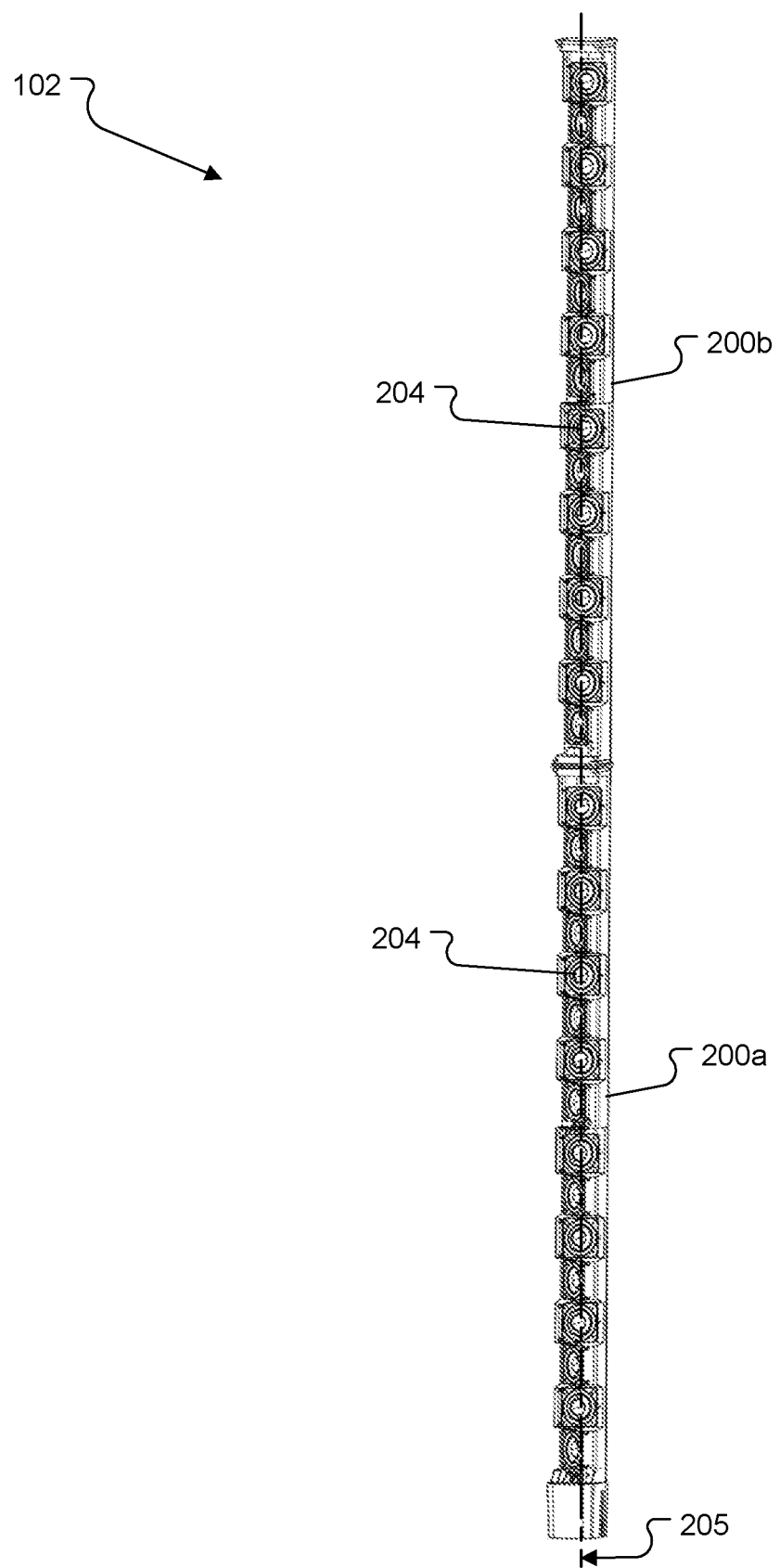
FIG. 2A is a perspective view of a line array assembly (shown without grilles) from the loudspeaker system of FIG. 1A shown from the front, top, and right side.
Figure 2B:
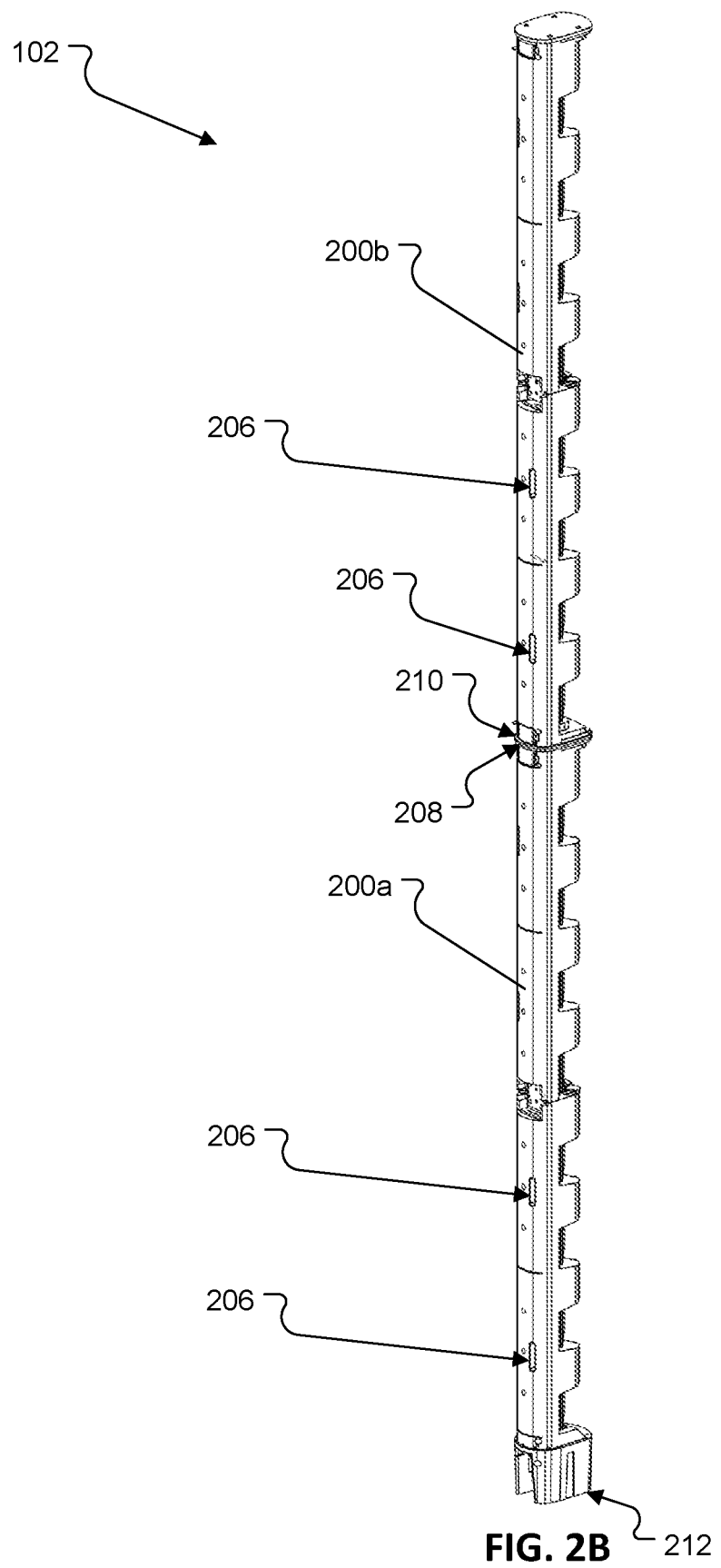
FIG. 2B is a perspective view of the line array assembly (shown without grilles) from FIG. 2A shown from the back, top, and left side.

With reference to FIGS. 2A and 2B, the line array assembly 102 includes a pair of array housings (referenced generally as "200") including a first, lower array housing 200a and a second, upper array housing 200b. Each of the array housings 200 defines an acoustic cavity 202 (FIG. 4A) and supports a plurality of electro-acoustic transducers 204, which are arranged along a vertical axis 205 (FIG. 2A). The array housings 106 may be formed, e.g., molded, from ABS. The electro-acoustic transducers 204 are mounted to their respective array housings 200 such that such that respective first radiating surfaces of the electro-acoustic transducers 204 radiate acoustic energy outwardly from a first surface of the corresponding one of the array housings 200 and respective second radiating surfaces of the electro-acoustic transducers radiate acoustic energy into the acoustic cavity 108 of the corresponding one of the array housings 200. A plurality of acoustic ports 206 disposed along the respective rear surfaces of the array housings 200 acoustically couple their respective acoustic cavities 108 to the region surrounding the array housings 200.

A first acoustically transparent grille 106 (FIG. 1A) on each array housing 200 covers the plurality of electro-acoustic transducers 204 along the front surface of the corresponding one of the array housings A second acoustically transparent grille 108 (FIG. 1B) on each array housing 200 covers the plurality of acoustic ports 206 along the rear surface of the corresponding one of the array housings 200.

The first array housing 200a carries a first electrical connector 400 (FIG. 4A) along its top end 208. The second array housing 200b carries a second, mating electrical connector 402 (FIG. 4A) along its bottom end 210. The first and second electrical connectors 400, 402 (FIG. 4A) provide a mechanical coupling between the two housings and enable electrical energy to be delivered to the electro-acoustic transducers 204 carried in the second array housing 200b.

A third electrical connector 404 (FIG. 4A; see also FIG. 6B) is arranged at a bottom end portion of the line array assembly 102 (i.e., at the bottom end 212 of the first array housing 200a) for enabling an electrical connection between the line array assembly 102 and the base 104. The third electrical connector 404 is electrically connected to respective electro-magnetic motors of the electro-acoustic transducers 204 carried by the first array housing 200a and to the first electrical connector 400 for passing an electrical signal to the second array housing 200b (i.e., via the second electrical connector 402).

Figure 3A:
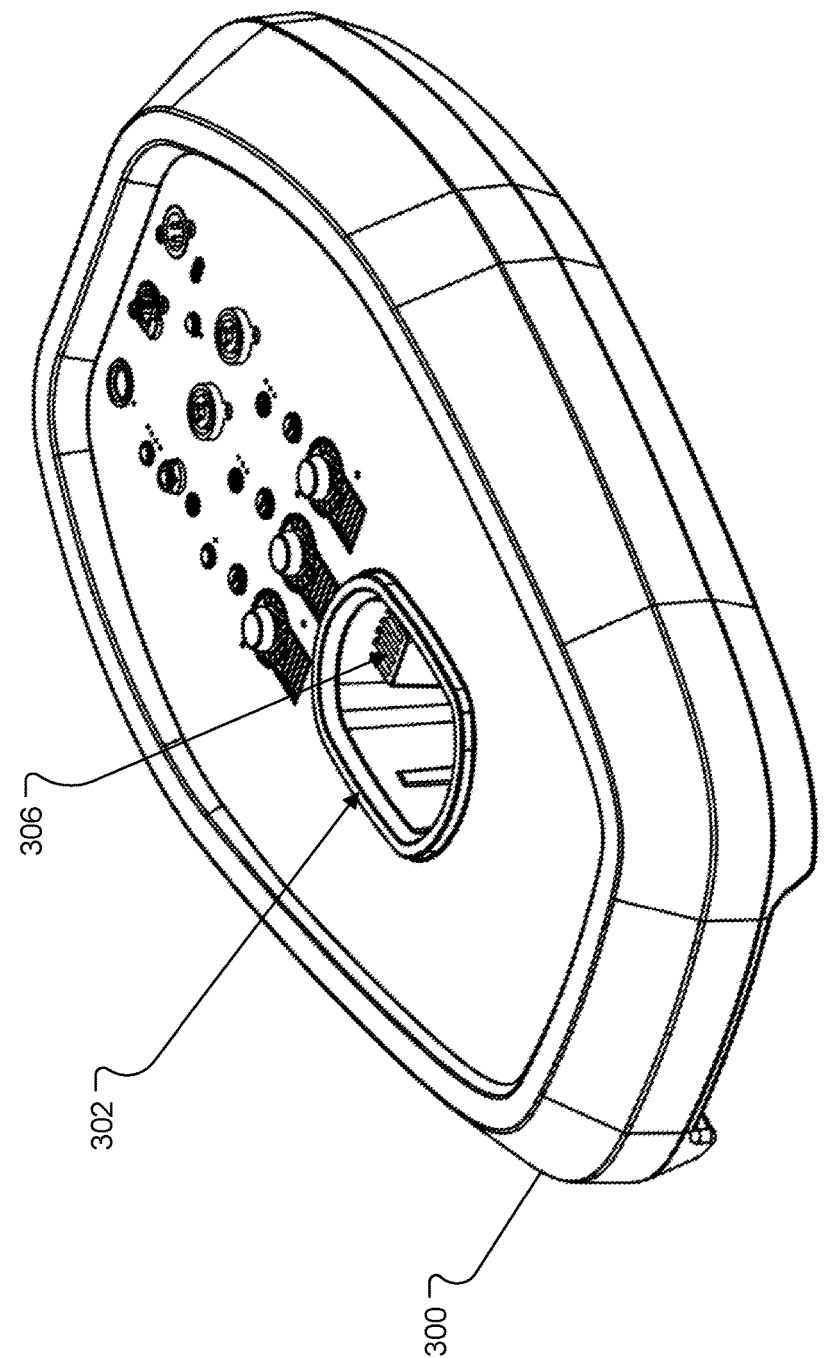
FIG. 3A is a perspective view of a base from the loudspeaker system of FIG. 1A shown from the front and right side.
Figure 3B:
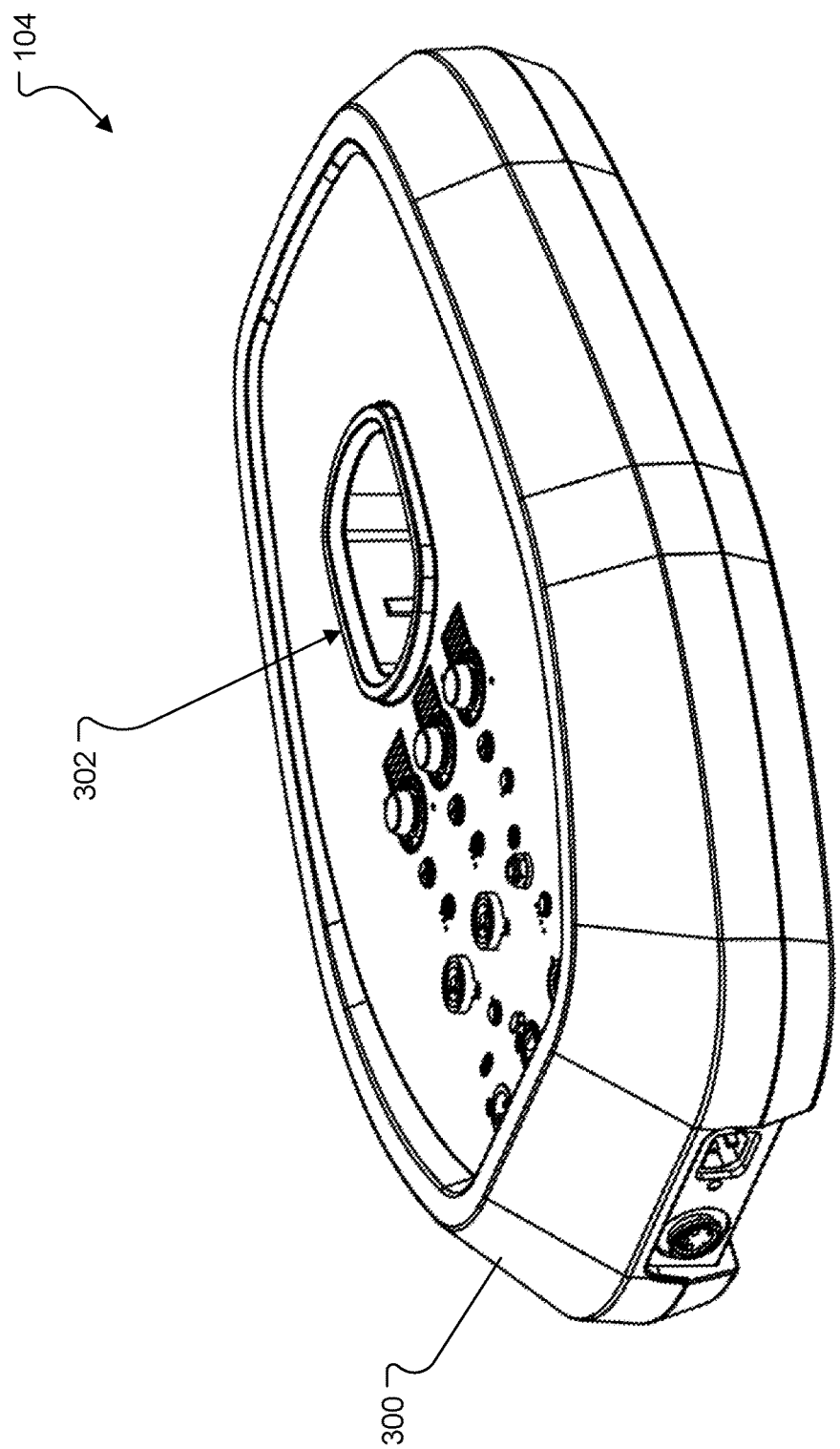
FIG. 3B is a perspective view of the base from FIG. 3A shown from the back, top, and left side.

Referring to FIGS. 3A and 3B, the base 104 includes a base housing 300 that supports a receptacle 302 that is configured to releasably receive the bottom end portion of the line array assembly 102. The base housing 300 may be formed, e.g., molded, from Polypropylene. A fourth electrical connector 406 (FIG. 4A) is disposed in the receptacle 302 and is arranged for coupling with the third electrical connector 404 (FIG. 4A) for establishing an electrical connection between the base 104 and the line array assembly 102.

Figure 4A:
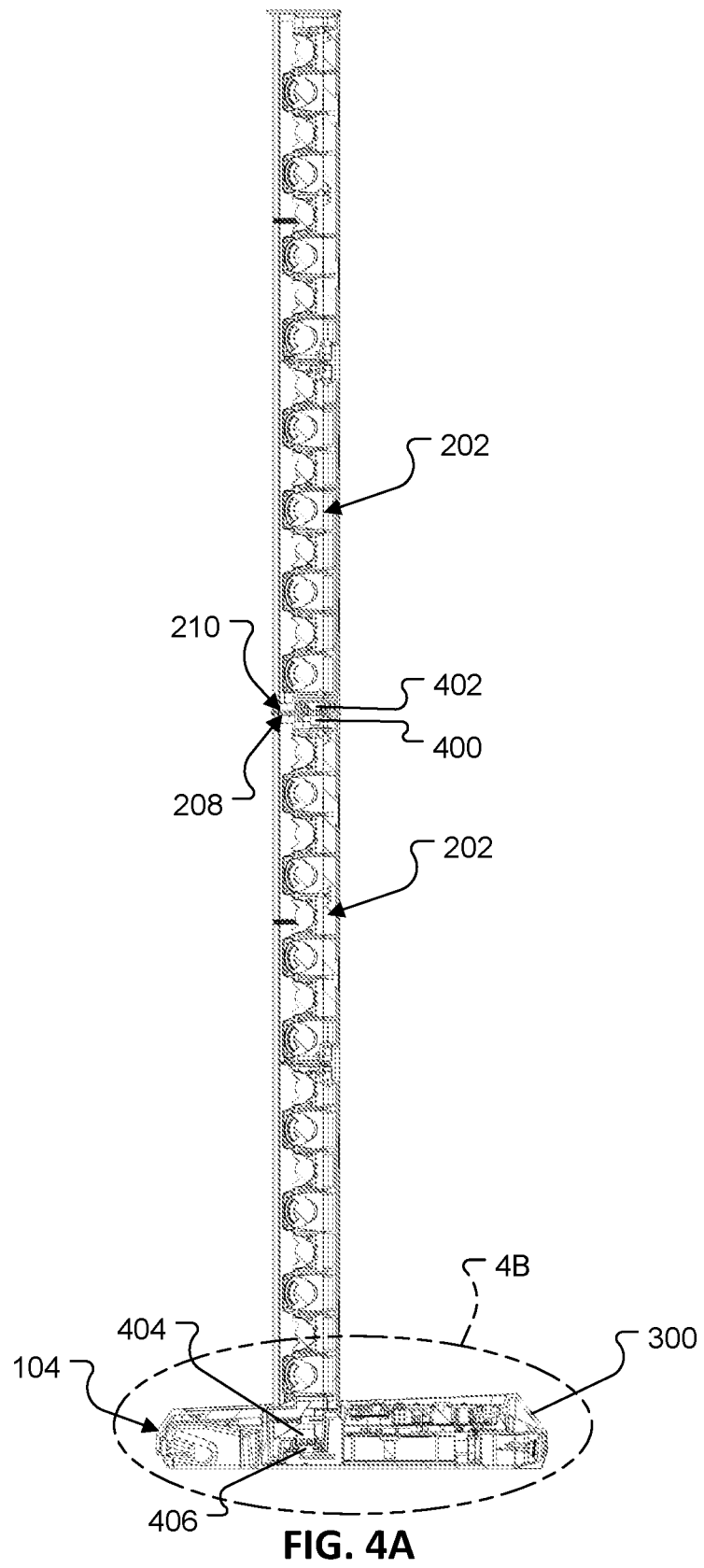
FIG. 4A is cross-sectional side view of the loudspeaker system of FIG. 1A.
Figure 4B:
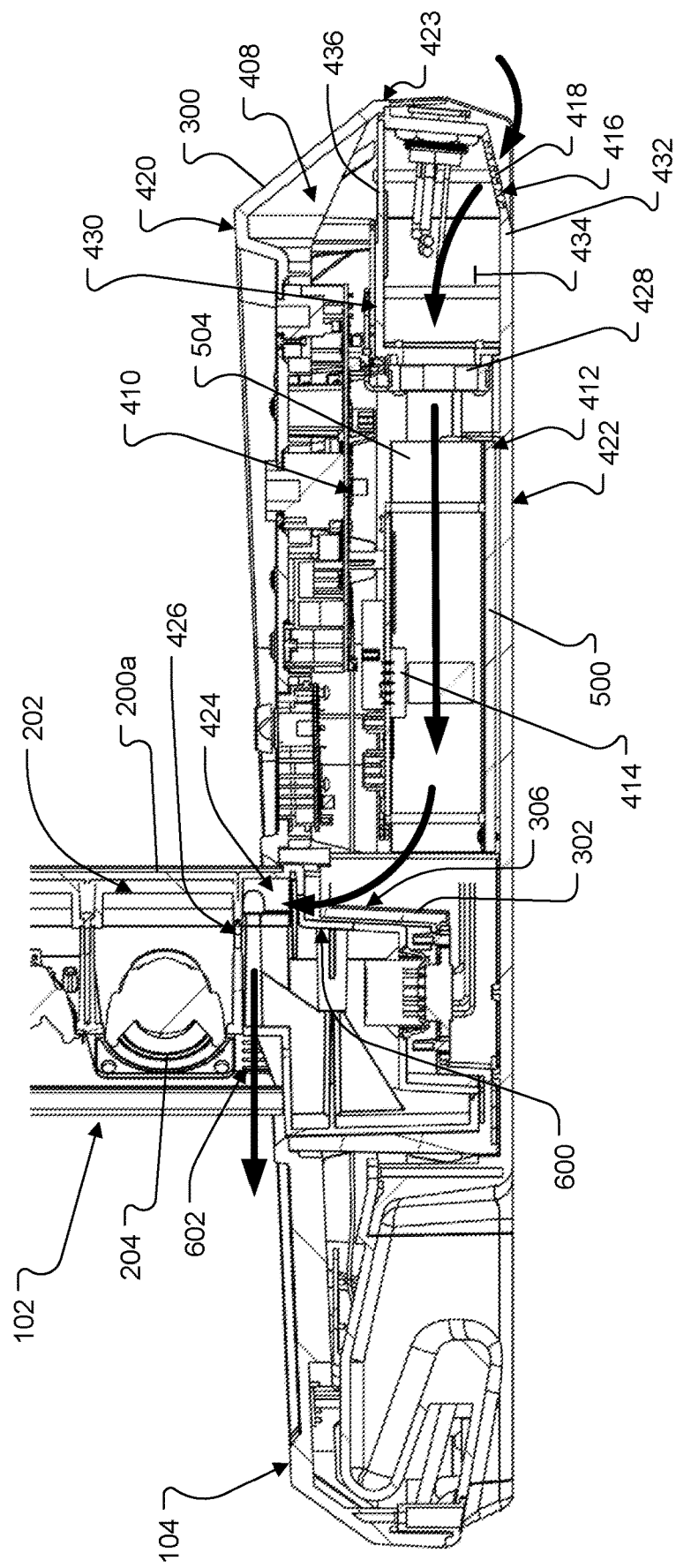
FIG. 4B is a detailed cross-sectional view from FIG. 4A.

With reference to FIGS. 4A and 4B, the base housing 300 defines an electronics cavity 408 within which electronics 410 for powering the line array assembly 102 are disposed. The electronics 410 are thermally coupled the receptacle via a heatsink 412. The heatsink 412 is formed of material with high thermal conductivity such as a metal, e.g., aluminum. In some cases, the heatsink 412 is formed integrally with the receptacle 302 (FIGS. 3A & 3B); however, in the illustrated example the heatsink 412 and the receptacle 302 are formed as two separate pieces that are coupled together.

Figure 5:
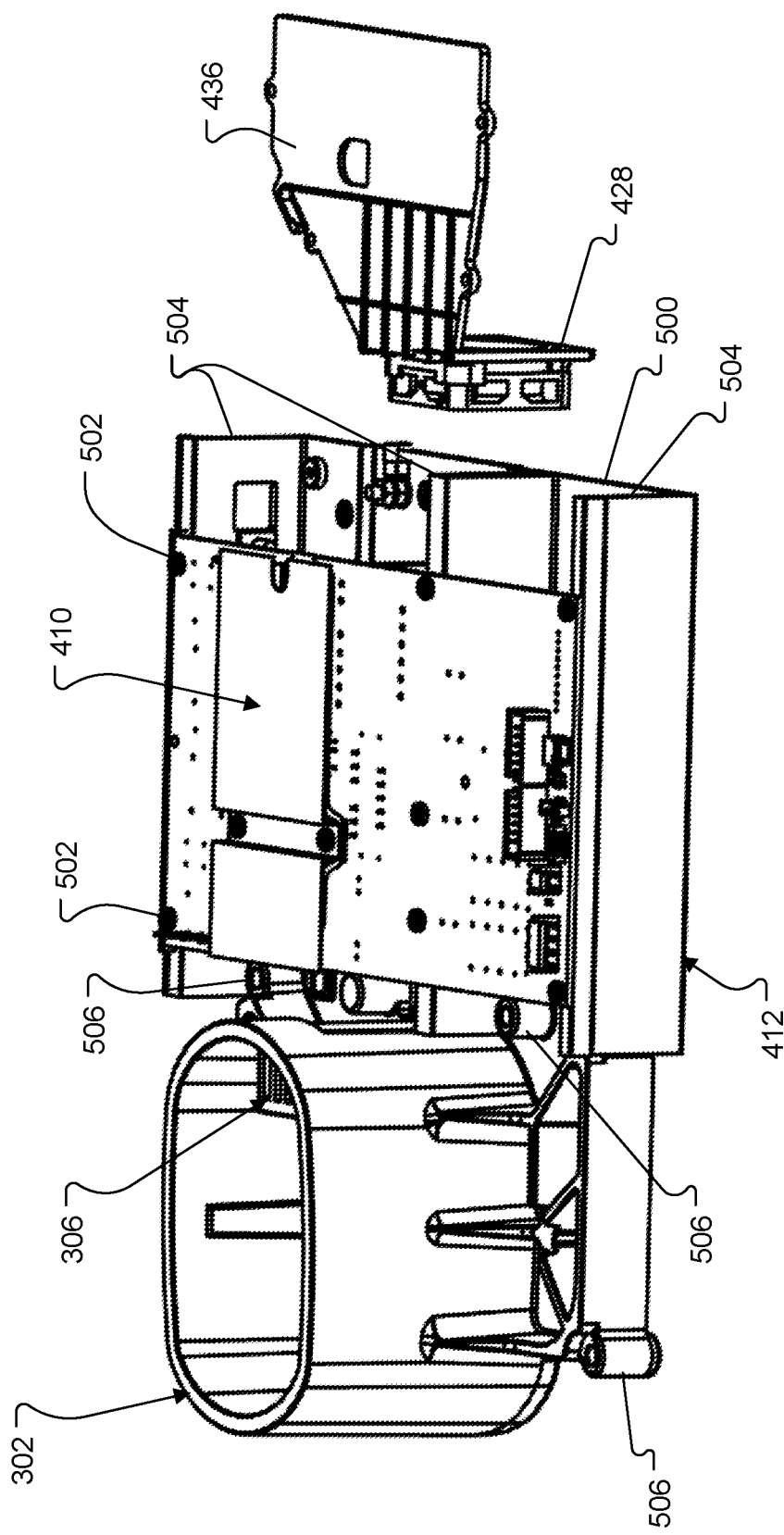
FIG. 5 is a perspective view of a receptacle, heatsink, electronics, air mover, and a portion of a duct from the base of FIG. 3A shown from the top and right side.

As shown in FIGS. 5A and 5B, the heatsink 412 includes a plate 500 that extends outwardly from the receptacle 302 and supports the electronics 410. In that regard, the electronics 410 may be secured to the plate 500 via fasteners 502. In some cases, standoffs are provided between the electronics 410 to the plate 500, for additional support, and the electronics 410 may be coupled to the plate 500 via the standoffs. The heatsink 412 also includes a plurality of fins 504 that extend outwardly from the plate 500. The fins 504 can assist is dissipating thermal energy. At least one of the fins 504 abuts a heat producing component (amplifier 414, FIG. 4B) of the electronics 410 for dissipating thermal energy therefrom. In some cases, a thermally conductive grease is disposed between the fin and the heat producing component 414 to provide a thermally conductive path therebetween. A suitable thermally conductive grease is Therm-a-gap Gel 30 available from Parker Chromerics. The receptacle 302 further defines a plurality of mounting tabs 506 for securing the receptacle 302 to the heatsink 412 and to the base housing 300.

Referring to FIG. 4B, the electronics 410 are disposed between a first set of apertures 416 that are formed in the base housing 300 and a second set of apertures 306 (FIGS. 3A, 5, & 6A) that are formed in the receptacle 302. The first set of apertures 416 are arranged on a tapered wall 418, between top and bottom surfaces 420, 422, respectively, of the base housing 300, along a rear end portion 423 of the base housing 300. The second set of apertures 306 align with a third set of apertures 600 (FIG. 6B) in a rear surface of the first array housing 200a. A fourth set of apertures 602 (FIG. 6C) in the front surface of the first array housing 200a is in fluid communication with the third set of apertures 600. In the example illustrated in FIG. 4B, the first array housing 200a defines an air flow cavity 424 that is acoustically isolated from the acoustic cavity 202 via a separating wall 426.

Figure 6A:
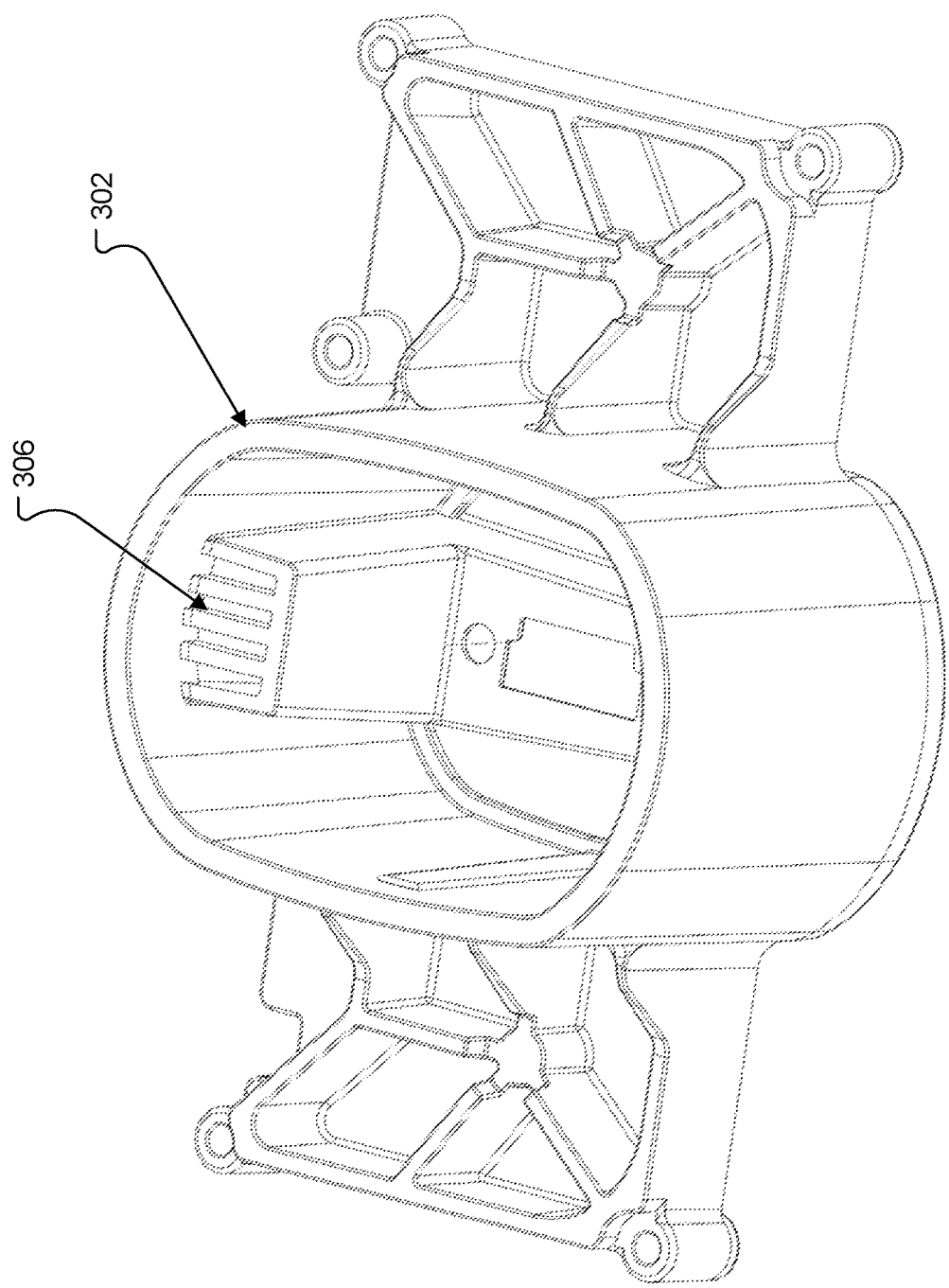
FIG. 6A is a perspective view of the receptacle of FIG. 5 shown from the front, top, and right side.
Figure 6B:
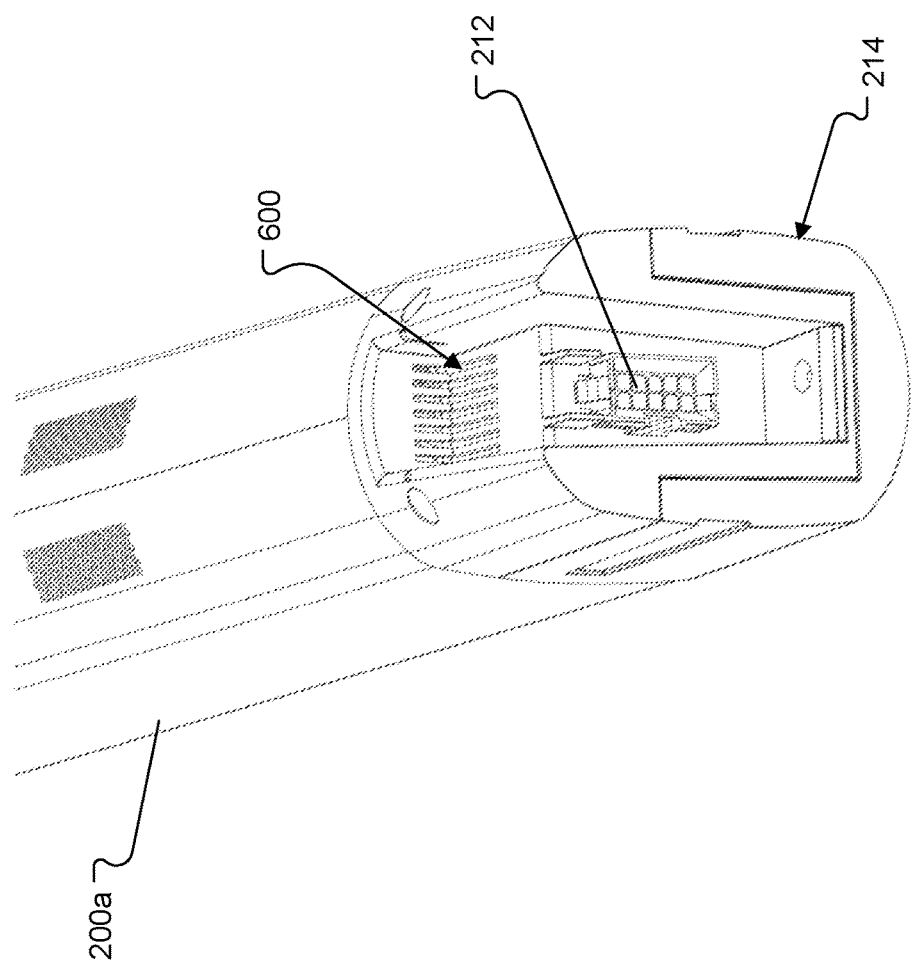
FIG. 6B is a perspective view of a bottom end portion of the line array assembly from the loudspeaker system of FIG. 1A shown from the bottom, back (rear), and right side.
Figure 6C:
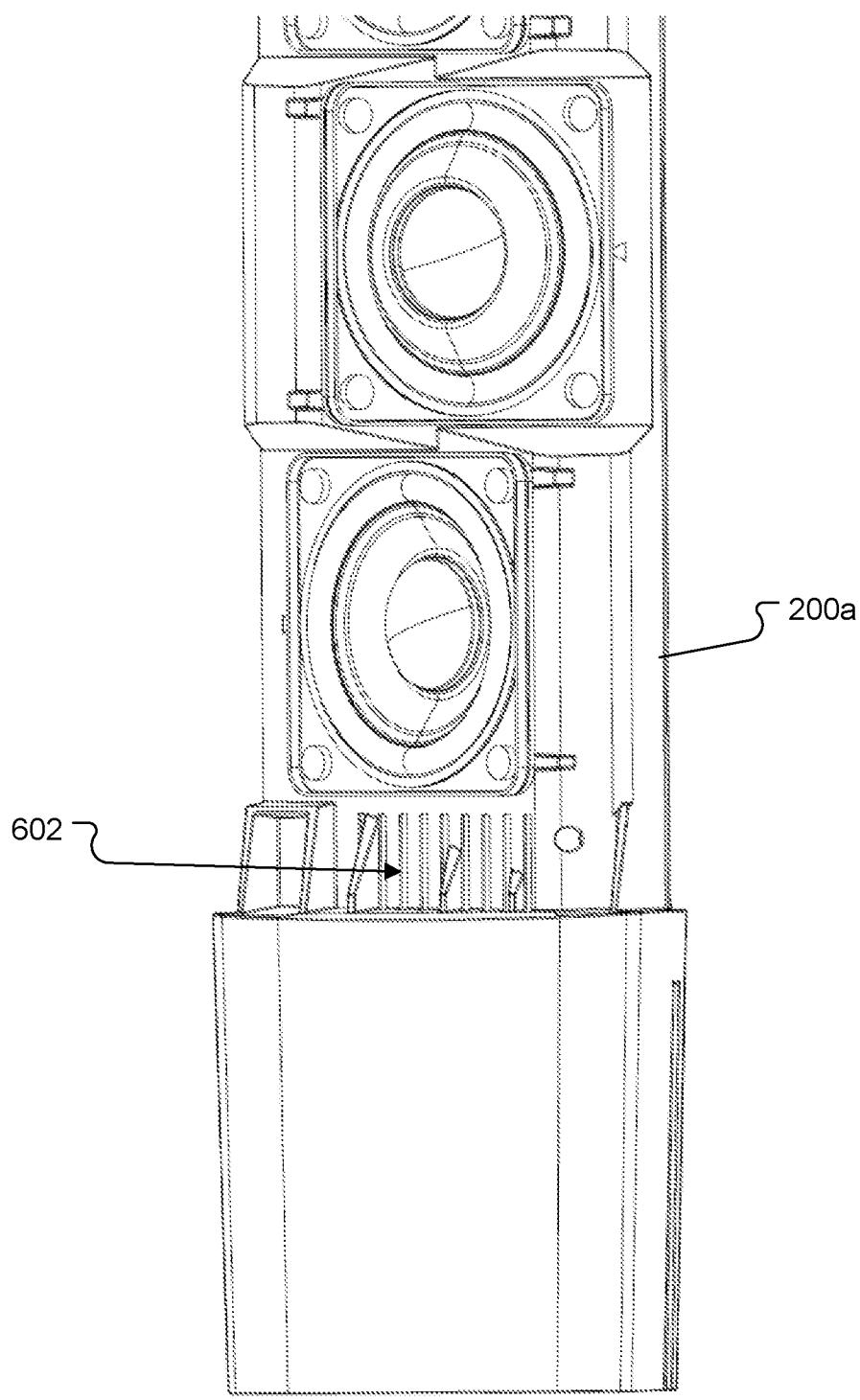
FIG. 6C is a perspective view of the bottom end portion of the line array assembly of FIG. 6B shown from the front and right side.

A convective air flow (illustrated as arrows in FIG. 4B) enters the electronics cavity 408 via the first set of apertures 416 and passes across the electronics 410 and the heatsink 412 before it is exhausted from the electronics cavity 408 through the second set of apertures 306 (see also FIG. 6A). The convective airflow then passes into the air flow cavity 424 via the third set of apertures 600 (FIG. 6B) in the rear surface of the first array housing 200a and is exhausted from the air flow cavity 424 through the fourth set of apertures 602 (see also FIG. 6C) in the front surface of the first array housing 200a. In some implementations, the convective air flow has a flow rate of about 0.2 m/s to about 1.5 m/s.

Movement of the convective air flow may be induced by the chimney effect and/or may be aided by an air mover 428 (e.g., a fan or blower). In the example illustrated in FIG. 4B, an air mover 428 (see also FIG. 5) is disposed in the electronics cavity 408 upstream of the electronics 410. The air mover 428 is arranged to direct the convective air flow towards the electronics 410 and the heatsink 412 to facilitate convective cooling thereof. As shown in FIG. 4B, the air mover 428 may be coupled to an outlet end of a duct 430. An opposite, inlet end of the duct 430 is arranged adjacent the first set of apertures 416. The duct 430 fluidically couples the first set of apertures 416 to the air mover 428, such that the air mover 428 draws cool ambient air into the duct 430 via the first set of apertures 416. In the illustrated example, a bottom wall 432 and a plurality of sidewalls 434 (one shown) of the duct 430 are defined by the base housing 300 and top wall 436 (see also FIG. 5) of the duct 430 is provided as a separate piece that is fastened to the sidewalls 434 to form the duct 430. A suitable air mover is Delta AFB0405LA.

Other Implementations

While various sets of apertures in the base and line array assembly are shown and described, any or all of the sets of apertures may consist of a single aperture.

Figure 7:
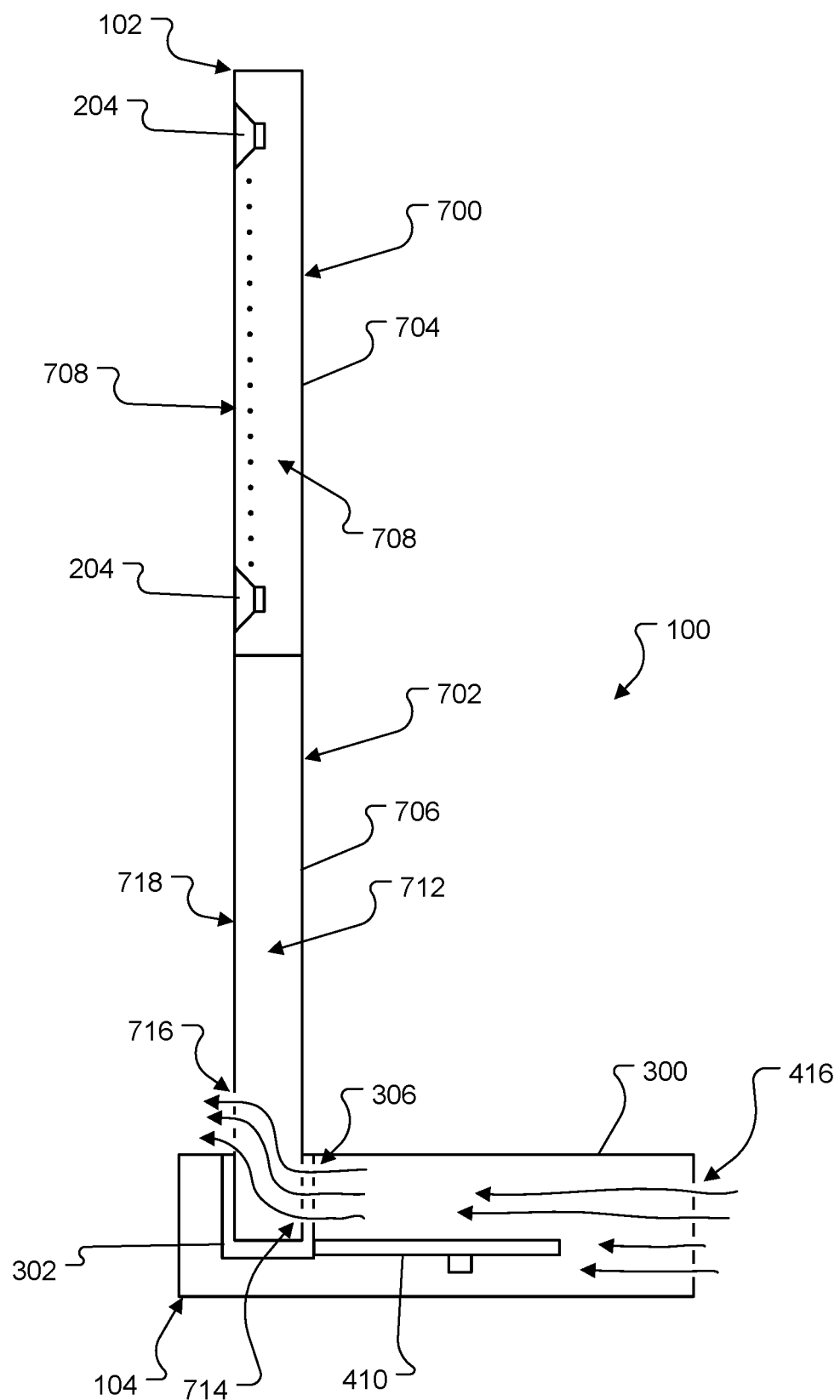
FIG. 7 is a schematic cross-sectional side view of an implementation of a loudspeaker system that includes an extension member for supporting a line array.

With reference to FIG. 7, in some implementations, the line array assembly 102 may include a line array 700 and an extension member 702. The line array 700 may include a first housing 704 and the extension member 702 may include a second housing 706. The first housing 704 defines an acoustic cavity 708. The first housing 704 supports the electro-acoustic transducers 204 such that respective first radiating surfaces of the electro-acoustic transducers 204 radiate acoustic energy outwardly from a first (front) surface 710 of the first housing 704 and respective second radiating surfaces of the electro-acoustic transducers 204 radiate acoustic energy into the acoustic cavity 708. The second housing 706 defines an air flow cavity 712 for accommodating the convective air flow. The second housing 706 is releasably coupled to the first housing 704. As in the implementation described above, a series of electrical connectors, and electrical wiring, may be used to establish an electrical connection between electronics 410 housed in the base housing 300 and the electro-acoustic transducers 204. A convective air flow (arrows) passes from the first set of apertures 416 near the rear of the base housing 300 through the second set of apertures 306 in the receptacle 302 and into the second housing 706 via a third set of apertures 714 at the rear of the bottom end of the second housing 706 and is exhausted out through a fourth set of apertures 716 at a front surface 718 of the second housing 706.

Figure 8:
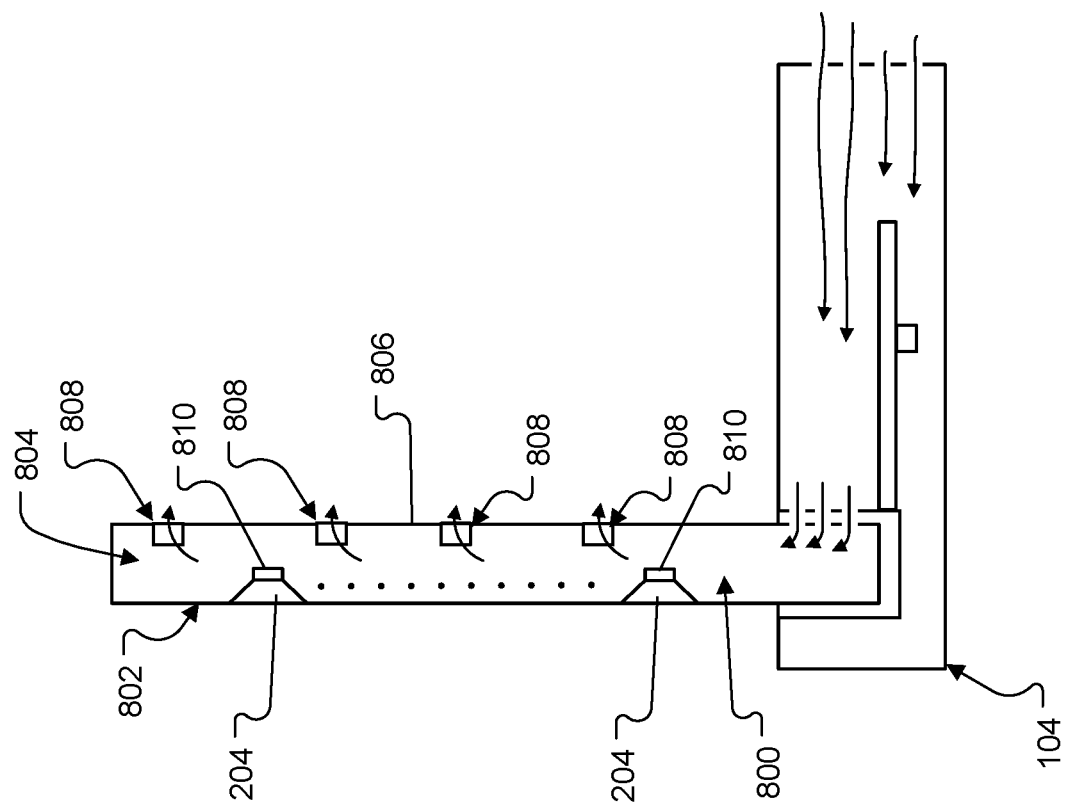
FIG. 8 is a schematic cross-sectional side view of another implementation of a loudspeaker system that enables a convective air flow to move through acoustic ports in a line array assembly.

While an implementation has been described in which a separate air flow cavity is provided in the line assembly which is acoustically isolated from the from the acoustic cavity, in some implementations, the convective air flow can pass from the base directly into the acoustic cavity, e.g., via apertures therebetween. For example, FIG. 8 illustrates an implementation of a loudspeaker system in which the convective air flow passes from the base 104 into an acoustic cavity 800 of a line array assembly 802 and is exhausted out the rear surface 804 of an array housing 806 through acoustic ports 808. In some instances, the convective air flow may also help to cool the electro-magnetic motors 810 of the electro-acoustic transducers 204 as it passes through the acoustic cavity 108. Alternatively, or additionally, acoustic ports may be provided in the front of the array housing 806 and the convective air flow may be exhausted from the acoustic ports in the front surface of the array housing 806.

Figure 9:
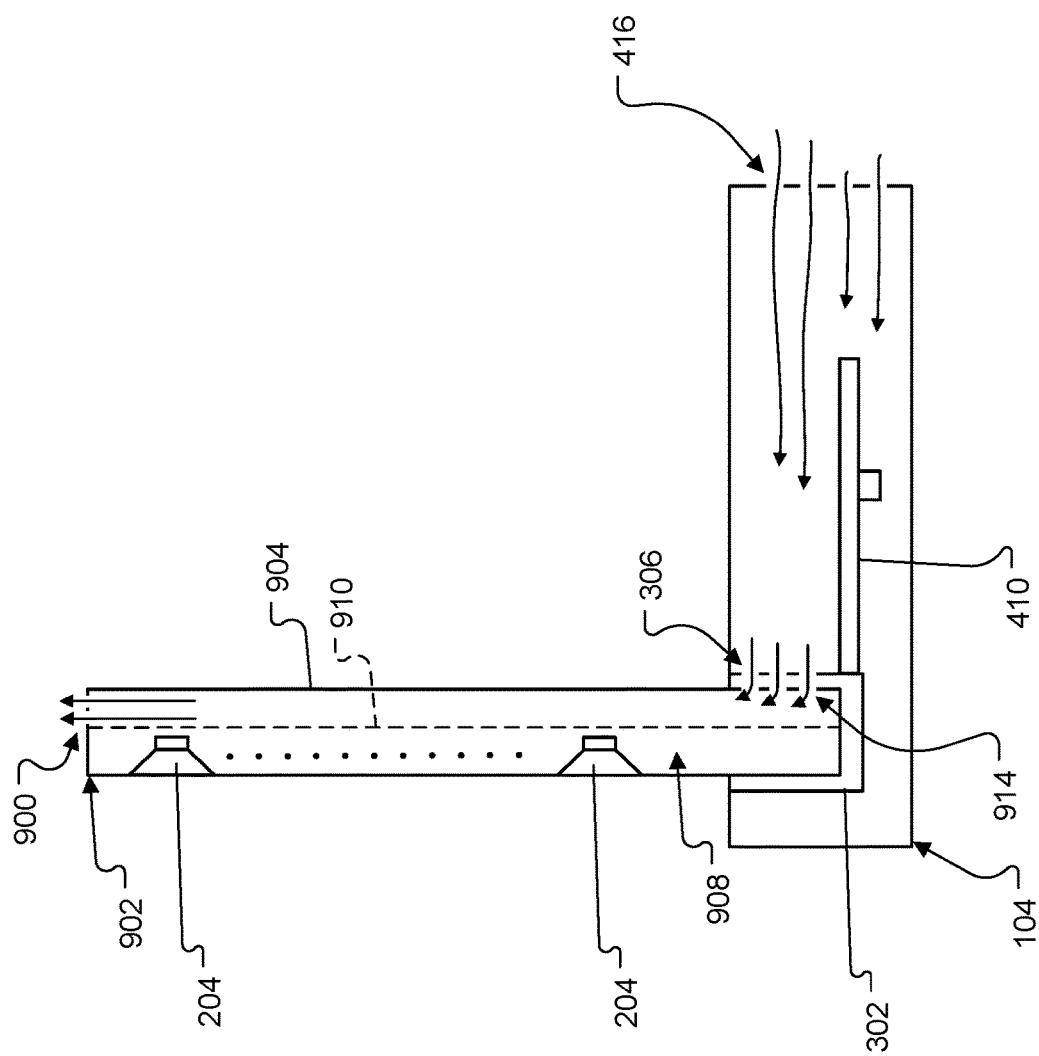
FIG. 9 is a schematic cross-sectional side view of yet another implementation of a loudspeaker system that enables a convective air flow to move vertically through a line array assembly and pass through apertures located at a top end of the line array assembly.

FIG. 9 illustrates yet another implementation in which a fourth set of apertures 900 are arranged at a top end 902 of an array housing 904 such that the convective air flow passes vertically through the line array assembly 906 and is vented out via a top surface of the array housing 904. The convective air flow may pass through an acoustic cavity 908 of the array housing 904, or, alternatively, a partition 910 may be provided to isolate the acoustic cavity 108 from a separate air flow cavity 912. The convective air flow (arrows) passes from the first set of apertures 416 near the rear of the base housing 300 through the second set of apertures 306 in the receptacle 302 and into the array housing 904 via a third set of apertures 914 at the rear of the bottom end of the array housing 904 and is exhausted out through the fourth set of apertures 900 at the top end 902 of the array housing 904.

While an implementation has been described in which the air mover is disposed in the electronics cavity in the base housing, in other implementations, the air mover may be disposed in line array, e.g., in the air flow cavity.

Figure 10:
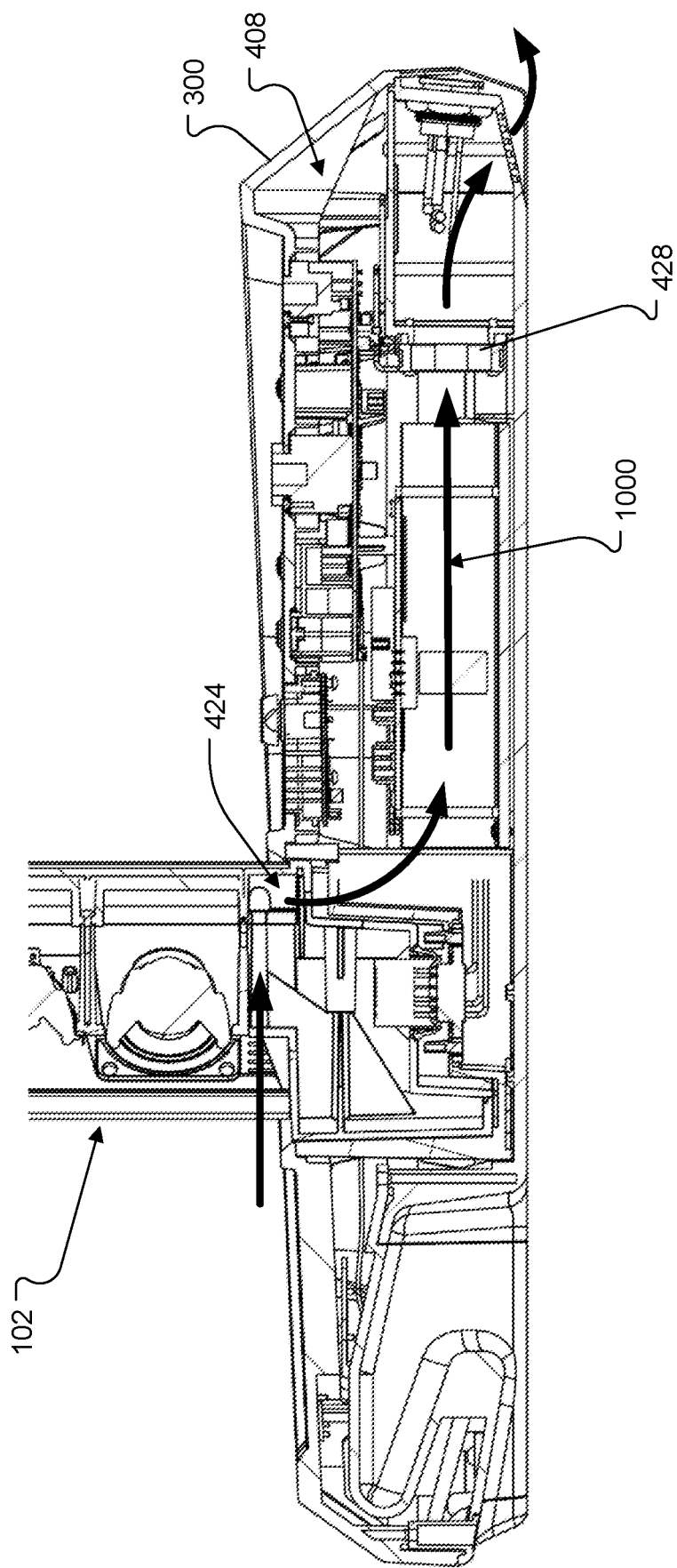
FIG. 10 is a detailed cross-sectional view from FIG. 4A illustrating an alternative convective air flow direction.

While implementations have been described in which a convective air flow is drawn into the electronics cavity of the base housing, then passes into the air flow cavity of the line array assembly, and then is exhausted from the air flow cavity, in other implementations, the direction of the convective air flow may be reversed. For example, with reference to FIG. 10, the air mover 428, which may be disposed in the air flow cavity 424 of the line array assembly 102 and/or in the electronics cavity 408 in the base housing 300 (as shown in FIG. 10), may draw the convective air flow 1000 first into the air flow cavity 424, then into the electronics cavity 408, and then exhaust it out of the electronics cavity 408 via the series of apertures.

Several implementations have been described. Nevertheless, it will be understood that additional modifications may be made without departing from the scope of the inventive concepts described herein, and, accordingly, other implementations are within the scope of the following claims.

What is claimed is:

1. A loudspeaker system comprising:
   a line array assembly comprising:
      a plurality of electro-acoustic transducers arranged along a vertical axis; and
      a base for supporting the line array assembly, the base housing electronics for powering the line array assembly,
   wherein the base and the line array assembly together define a flow path to facilitate a convective air flow to pass between the base and the line array assembly for cooling the electronics, and
   wherein the line array assembly comprises an array housing that defines an acoustic cavity, wherein the array housing supports the electro-acoustic transducers such that respective first radiating surfaces of the electro-acoustic transducers radiate acoustic energy outwardly from a first surface of the array housing and respective second radiating surfaces of the electro-acoustic transducers radiate acoustic energy into the acoustic cavity.

2. The loudspeaker system of claim 1, further comprising a receptacle supported by the base for receiving a portion of the line array assembly, wherein the base, the receptacle, and the line array assembly together define a flow path to facilitate a convective air flow to pass between the base and the line array assembly for cooling the electronics.

3. The loudspeaker system of claim 2, wherein the base comprises a base housing that defines an electronics cavity within which the electronics are enclosed,
   wherein the receptacle includes one or more first apertures in fluid communication with the electronics cavity, and
   wherein the line array assembly includes one or more second apertures which are placed in fluid communication with the one or more first apertures when the line array assembly is supported base.

4. The loudspeaker system of claim 3, wherein the housing includes one or more third apertures to allow ambient air to enter the electronics cavity.

5. The loudspeaker system of claim 4, further comprising an air mover arranged to draw a convective air flow into the electronics cavity via the one or more third apertures and to move the convective air flow across the electronics and toward the one or more first apertures.

6. The loudspeaker of claim 5, further comprising a duct that fluidically couples the air mover to the one or more third apertures.

7. The loudspeaker system of claim 3, wherein the line array assembly includes one or more third apertures in fluid communication with the one or more second apertures, thereby to allow the convective air flow to pass from the one or more second apertures through the line array assembly and out of the one or more third apertures.

8. The loudspeaker system of claim 2, further comprising a heat sink thermally coupled to the receptacle and the electronics, thereby to facilitate thermal heat transfer from the electronics to the receptacle.

9. The loudspeaker system of claim 8, wherein the heat sink formed integrally with the receptacle.

10. The loudspeaker system of claim 8, wherein the heatsink comprises a plate extending outwardly from the receptacle and supporting the electronics.

11. The loudspeaker system of claim 10, wherein the heatsink further comprises a fin that extends outwardly from the plate, the fin abutting a heat producing component of the electronics for dissipating thermal energy therefrom.

12. The loudspeaker system of claim 11, further comprising a thermally conductive grease disposed between the fin and the heat producing component to provide a thermally conductive path therebetween.

13. The loudspeaker system of claim 1, further comprising an air mover to encourage the convective air flow to move from the base into the line array assembly.

14. The loudspeaker system of claim 13, wherein the base comprises a base housing that defines an electronics cavity within which the electronics are enclosed, and wherein the air mover is disposed within the electronics cavity.

15. The loudspeaker system of claim 14, wherein the base housing includes one or more first apertures for allowing a convective air flow to enter the electronics cavity from a region external to the housing, and wherein the base further comprises a duct disposed within the electronics cavity and fluidically coupling the one or more first apertures to the air mover.

16. The loudspeaker system of claim 1, wherein the array housing further defines an air flow cavity for accommodating the convective air flow, the air flow cavity being acoustically isolated from the acoustic cavity.

17. The loudspeaker of claim 16, wherein the line array assembly includes one or more first apertures arranged along a rear surface of the housing, opposite the front surface, and in fluid communication with the air flow cavity, and one or more second apertures arranged along the front surface of the housing and in fluid communication with the air flow cavity such that the convective air flow can enter the air flow cavity via the one or more first apertures and can be exhausted from the air flow cavity via the one or more second apertures.

18. The loudspeaker system of claim 1, wherein the array housing is a first housing and the line array assembly further comprises a second housing,
   wherein the second housing defines an air flow cavity for accommodating the convective air flow, and
   wherein the second housing is releasably coupled to the first housing.

19. The loudspeaker system of claim 18, further comprising a receptacle supported by the base for receiving a portion of the line array assembly, wherein the base, the receptacle, and the line array assembly together define a flow path to facilitate a convective air flow from the base and through the line array assembly for cooling the electronics,
   wherein the receptacle is configured to receive a bottom end portion of the second housing.

20. The loudspeaker system of claim 1, further comprising an air mover arranged to encourage the convective air flow to move from the line array assembly and into the base.

21. The loudspeaker system of claim 3, wherein the housing includes one or more third apertures to allow the convective air flow to be exhausted from the electronics cavity.

22. The loudspeaker system of claim 3, wherein the line array assembly includes one or more third apertures in fluid communication with the one or more second apertures, thereby to allow the convective air flow to pass from the one or more third apertures through the line array assembly and out of the one or more second apertures.

23. The loudspeaker system of claim 22, further comprising an air mover arranged to draw a convective air flow into the line array assembly via the one or more third apertures and to move the convective air flow into the electronics cavity via the first and second apertures.

* * * * *